United States Patent
Terai et al.

(10) Patent No.: US 11,239,371 B2
(45) Date of Patent: Feb. 1, 2022

(54) THIN-FILM TRANSISTOR INCLUDING SOURCE-DRAIN ELECTRODES CONNECTED TO A SEMICONDUCTING FILM AND EXTENDING THROUGH A SEMICONDUCTOR AUXILIARY FILM

(71) Applicant: JOLED INC., Tokyo (JP)

(72) Inventors: Yasuhiro Terai, Tokyo (JP); Naoki Asano, Tokyo (JP); Takashi Maruyama, Tokyo (JP)

(73) Assignee: JOLED INC., Tokyo (JP)

( * ) Notice: Subject to any disclaimer, the term of this patent is extended or adjusted under 35 U.S.C. 154(b) by 279 days.

(21) Appl. No.: 16/518,437

(22) Filed: Jul. 22, 2019

(65) Prior Publication Data
US 2020/0266300 A1    Aug. 20, 2020

(30) Foreign Application Priority Data

Feb. 15, 2019  (JP) .............................. JP2019-025794

(51) Int. Cl.
| | |
|---|---|
| *H01L 29/786* | (2006.01) |
| *H01L 29/417* | (2006.01) |
| *H01L 29/66* | (2006.01) |
| *H01L 21/02* | (2006.01) |
| *H01L 29/45* | (2006.01) |

(Continued)

(52) U.S. Cl.
CPC .... *H01L 29/7869* (2013.01); *H01L 21/02565* (2013.01); *H01L 21/02631* (2013.01); *H01L 29/4175* (2013.01); *H01L 29/41733* (2013.01); *H01L 29/66969* (2013.01); *H01L 29/78696* (2013.01); *H01L 21/0274* (2013.01); *H01L 21/02164* (2013.01); *H01L 21/02271* (2013.01); *H01L 21/465* (2013.01); *H01L 29/45* (2013.01)

(58) Field of Classification Search
CPC ........... H01L 29/7869; H01L 29/41733; H01L 29/4175; H01L 29/66969; H01L 29/78696; H01L 21/02565; H01L 21/02631; H01L 51/105
See application file for complete search history.

(56) References Cited

U.S. PATENT DOCUMENTS

| | | | |
|---|---|---|---|
| 2014/0326992 A1* | 11/2014 | Hondo | .............. H01L 29/41733 257/43 |
| 2015/0162399 A1 | 6/2015 | Sato | |
| 2016/0049479 A1* | 2/2016 | Liu | ..................... H01L 27/1222 257/72 |

FOREIGN PATENT DOCUMENTS

JP    2015-108731 A    6/2015

* cited by examiner

*Primary Examiner* — Matthew E. Gordon
(74) *Attorney, Agent, or Firm* — Hauptman Ham, LLP

(57) ABSTRACT

A semiconductor device includes a semiconductor film, an interlayer insulating film, a source-drain electrode, and a semiconductor auxiliary film. The semiconductor film includes an oxide semiconductor material and has a channel region and a low-resistance region. The low-resistance region has an electric resistance lower than an electric resistance of the channel region. The interlayer insulating film covers the semiconductor film and has a through-hole opposed to the low-resistance region. The source-drain electrode includes a source electrode and a drain electrode and is electrically coupled to the semiconductor film through the through-hole. The semiconductor auxiliary film is in contact with the low-resistance region of the semiconductor film, reduces an electric resistance of the semiconductor film, and has a first opening at least on a part of a portion opposed to the through-hole.

20 Claims, 11 Drawing Sheets

(51) Int. Cl.
*H01L 21/027* (2006.01)
*H01L 21/465* (2006.01)

THIN-FILM TRANSISTOR INCLUDING SOURCE-DRAIN ELECTRODES CONNECTED TO A SEMICONDUCTING FILM AND EXTENDING THROUGH A SEMICONDUCTOR AUXILIARY FILM

CROSS REFERENCE TO RELATED APPLICATIONS

This application claims the benefit of Japanese Priority Patent Application No. 2019-025794 filed on Feb. 15, 2019, the entire contents of which are incorporated herein by reference.

BACKGROUND

The technology relates to a semiconductor device including an oxide semiconductor material and to a display.

A display including pixels with higher definition has been recently developed. Such a display is driven by a thin-film transistor (TFT). For example, a thin-film transistor including an oxide semiconductor material has been intensively developed. Reference is made to Japanese Unexamined Patent Application Publication No. 2015-108731, for example.

SUMMARY

It is desired for a semiconductor device that includes a thin-film transistor including an oxide semiconductor material to reduce a change in its characteristics, such as gate voltage-drain current (Vg-Id) characteristic.

It is desirable to provide a semiconductor device that makes it possible to reduce a change in its characteristics, and a display including such a semiconductor device.

A semiconductor device according to one embodiment of the technology includes a semiconductor film, an interlayer insulating film, a source-drain electrode, and a semiconductor auxiliary film. The semiconductor film includes an oxide semiconductor material and has a channel region and a low-resistance region. The low-resistance region has an electric resistance lower than an electric resistance of the channel region. The interlayer insulating film covers the semiconductor film and has a through-hole opposed to the low-resistance region. The source-drain electrode includes a source electrode and a drain electrode and is electrically coupled to the semiconductor film through the through-hole. The semiconductor auxiliary film is in contact with the low-resistance region of the semiconductor film, reduces an electric resistance of the semiconductor film, and has a first opening at least on a part of a portion opposed to the through-hole.

A display according to one embodiment of the technology includes a display element and a semiconductor device configured to drive the display element. The semiconductor device includes a semiconductor film, an interlayer insulating film, a source-drain electrode, and a semiconductor auxiliary film. The semiconductor film includes an oxide semiconductor material and has a channel region and a low-resistance region. The low-resistance region has an electric resistance lower than an electric resistance of the channel region. The interlayer insulating film covers the semiconductor film and has a through-hole opposed to the low-resistance region. The source-drain electrode includes a source electrode and a drain electrode and is electrically coupled to the semiconductor film through the through-hole. The semiconductor auxiliary film is in contact with the low-resistance region of the semiconductor film, reduces an electric resistance of the semiconductor film, and has a first opening at least on a part of a portion opposed to the through-hole.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

FIG. 1 is applied.

FIG. 1 is applied.

DETAILED DESCRIPTION

Some example embodiments of the technology will now be described in detail with reference to the attached drawings. Note that the description is given in the following order.
1. Embodiments (Example Semiconductor Device Including Semiconductor Auxiliary Film Having Opening)
2. Modification Examples (Semiconductor Auxiliary Film Having Opening in Entirety of Portion Opposed to Through-hole of Interlayer Insulating Film)
3. Application Example 1 (Display and Imaging Unit)
4. Application Example 2 (Electronic Apparatus)

Embodiments

[Configuration]

Figure 1:
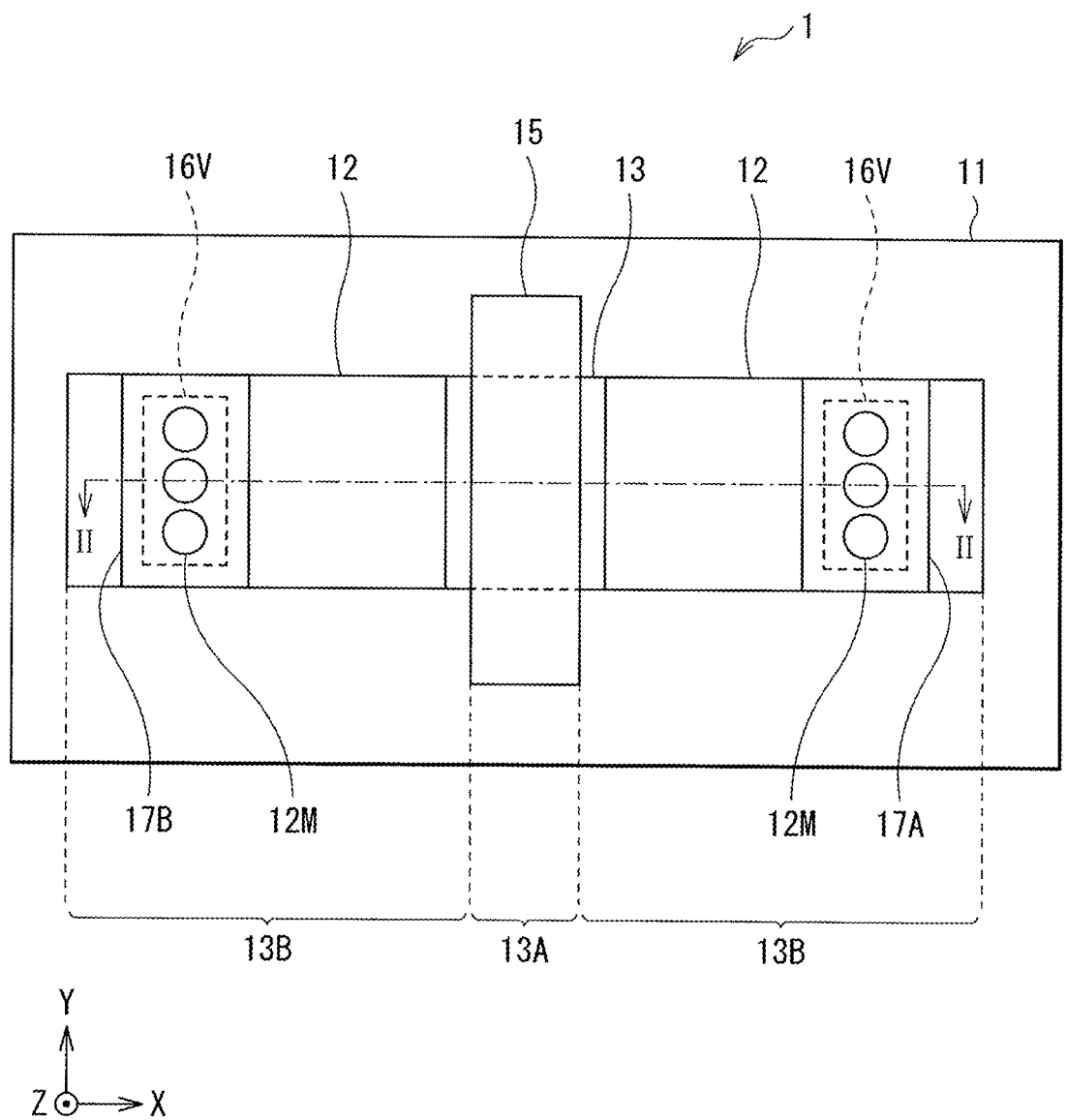
FIG. 1 is a schematic plan view of a semiconductor device according to one example embodiment of the technology for illustrating an example structure of a main portion of the semiconductor device.
Figure 2:
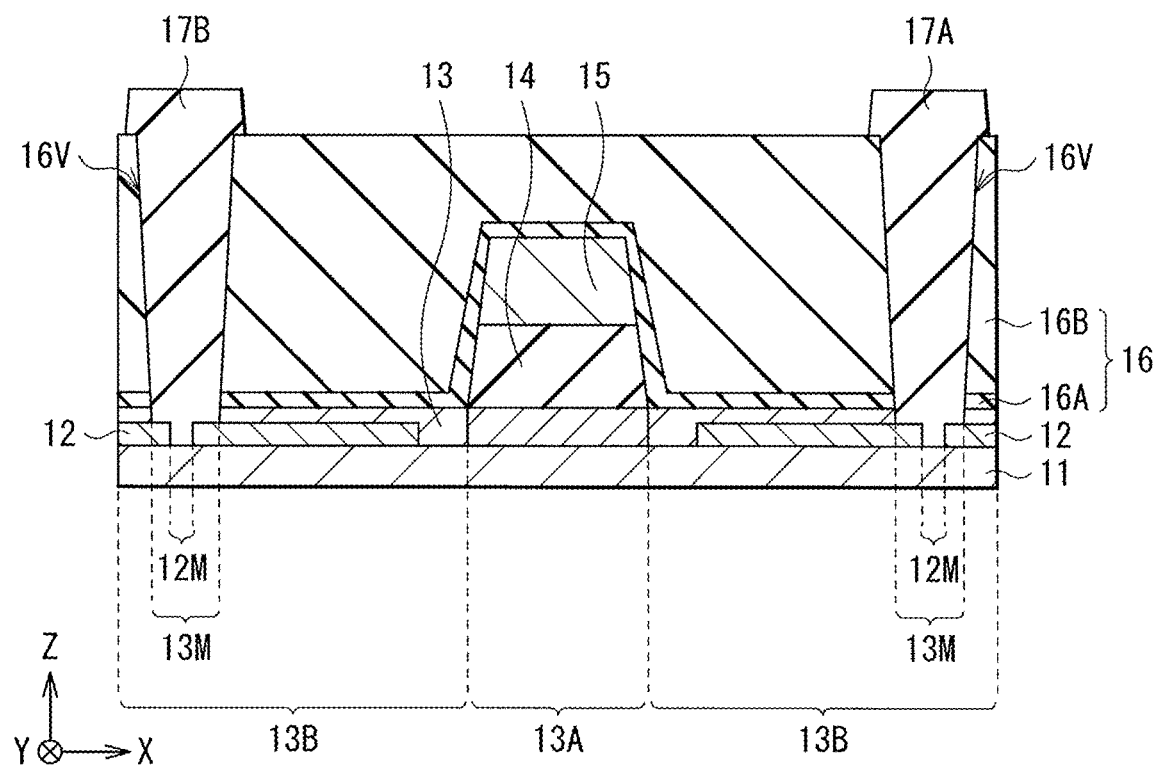
FIG. 2 is a schematic diagram illustrating an example cross-sectional configuration of the semiconductor device illustrated in FIG. 1 taken along the line II-II in FIG. 1.

FIGS. 1 and 2 schematically illustrate a main portion of a semiconductor device 1 according to an example embodiment of the technology. FIG. 1 is a plan view of the main portion of the semiconductor device 1, and FIG. 2 is a cross-sectional view of the semiconductor device 1 taken along the line II-II in FIG. 1. The semiconductor device 1 serves as a driving circuit that drives a display (e.g., a display 2A illustrated in FIG. 11 described below) or an imaging unit (e.g., an imaging unit 2B illustrated in FIG. 12 described below), for example. The semiconductor device 1 may include, in this order on a substrate 11, a semiconductor auxiliary film 12, a semiconductor film 13, a gate insulating film 14, a gate electrode 15, an interlayer insulating film 16, and paired source-drain electrodes 17A and 17B. In other words, the semiconductor device 1 may include a top-gate thin-film transistor.

A portion of the semiconductor film 13 that is opposed to the gate electrode 15 may be a channel region 13A of the thin-film transistor. The semiconductor film 13 has low-resistance regions 13B adjacent to the channel region 13A. The low-resistance regions 13B may each have an electric resistance lower than that of the channel region 13A. In other words, the semiconductor device 1 may have the thin-film transistor having a self-aligned structure.

The interlayer insulating film 16 may have paired through-holes 16V. The paired source-drain electrodes 17A and 17B may be coupled to the respective low-resistance regions 13B of the semiconductor film 13 through the respective through-holes 16V. Some components of the semiconductor device 1 will now be described.

The substrate 11 may include glass, quartz, or silicon, for example. Alternatively, the substrate 11 may include a resin material, such as polyethylene terephthalate (PET), polyimide (PI), polycarbonate (PC), or polyethylene naphthalate (PEN). Still alternatively, the substrate 11 may include a plate of metal, such as stainless steel (SUS), on which an insulating material film is formed, for example.

The semiconductor auxiliary film 12 provided between the substrate 11 and the semiconductor film 13 may be disposed in a selective region on the substrate 11. For example, the semiconductor auxiliary film 12 may be over-laid with the low-resistance regions 13B of the semiconductor film 13 in plan view (on the X-Y plane of FIG. 1), and may be in contact with a bottom surface, adjacent to the substrate 11, of the semiconductor film 13. Additionally, the semiconductor auxiliary film 12 may not be overlaid with the channel region 13A of the semiconductor film 13 in plan view. In other words, the semiconductor auxiliary film 12 may be provided in a selective region opposed to the low-resistance regions 13B of the semiconductor film 13 having the channel region 13A and the low-resistance regions 13B.

The semiconductor auxiliary film 12 selectively in contact with the low-resistance regions 13B of the semiconductor film 13 reduces an electric resistance of the low-resistance regions 13B. In other words, the semiconductor auxiliary film 12 has a property of lowering the electric resistance of the low-resistance regions 13B. For example, the semiconductor auxiliary film 12 may supply carriers to the low-resistance regions 13B of the semiconductor film 13. In other words, the semiconductor auxiliary film 12 may have a carrier-supplying property with respect to the semiconductor film 13. This increases the electrical conductivity of the low-resistance regions 13B, lowering the electric resistance of the low-resistance regions 13B. Alternatively, the semiconductor auxiliary film 12 may have electrical conductivity. Such a semiconductor auxiliary film 12 itself may serve as a conductor in the low-resistance regions 13B, and cause, together with the semiconductor film 13, an electric current to flow through the semiconductor auxiliary film 12. This makes it possible to lower the electric resistance of the low-resistance regions 13B. The semiconductor auxiliary film 12 may include, for example, a metal or a metal oxide. Specific but non-limiting examples of the material of the semiconductor auxiliary film 12 may include aluminum (Al), an alloy including aluminum, a metal oxide including indium (In), and a metal oxide including zinc (Zn). Specific but non-limiting examples of the alloy including aluminum may include aluminum-silicon (AlSi) alloy and aluminum-copper (AlCu) alloy. Specific but non-limiting examples of the metal oxide including indium may include indium tin oxide (ITO) and indium zinc oxide (IZO). Specific but non-limiting example of the metal oxide including zinc may include zinc oxide (ZnO) and aluminum-doped zinc oxide (AZO). The metal or the metal oxide in the semiconductor auxiliary film 12 may be different in material or composition from the oxide semiconductor material of the semiconductor film 13. The semiconductor auxiliary film 12 may have a thickness of about 2 nm to about 25 nm, for example. The semiconductor auxiliary film 12 having the carrier-supplying property or the electrical conductivity makes it possible to stably keep the electric resistance of the low-resistance regions 13B at a low level. Even if openings (e.g., openings 13M described below) are formed in the semiconductor film 13 by overetching for forming the through-holes 16V, the semiconductor auxiliary film 12 makes it possible to suppress a decrease in electrical conductivity of the low-resistance regions 13B.

In this example embodiment, the semiconductor auxiliary film 12 includes openings 12M. Each of the openings 12M is opposed to the corresponding through-hole 16V of the interlayer insulating film 16. An underlying layer (e.g., an UC film described below) below the semiconductor auxiliary film 12 may be exposed in the openings 12M. Although described in detail below, the semiconductor auxiliary film 12 having the openings 12M suppresses migration of oxygen from the semiconductor film 13 to the source-drain electrodes 17A and 17B through the semiconductor auxiliary film 12. The opening 12M may correspond to a specific but non-limiting example of a first opening according to one embodiment of the technology.

Each of the openings 12M is opposed to the corresponding through-hole 16V. The opening 12M may be smaller in area than the through-hole 16V in plan view, for example. For example, the opening 12M may be provided on a part of a portion opposed to the corresponding through-hole 16V. Alternatively, a plurality of openings 12M may be provided on the portion opposed to the corresponding through-hole 16V. The opening 12M may have a circular shape in plan view. Alternatively, the opening 12M may have a shape other than the circular shape in plan view.

A undercoat (UC) film may be provided between the substrate 11 and the semiconductor auxiliary film 12, or between the substrate 11 and the semiconductor film 13. The UC film may suppress migration of substances, such as sodium ions, from the substrate 11 to an upper layer. The UC film may include an insulating material, such as silicon nitride (SiN) or silicon oxide (SiO).

The semiconductor film 13 may be provided in a selective region on the substrate 11 so as to cover the semiconductor auxiliary film 12. The semiconductor film 13 may include an oxide semiconductor that mainly, but not limited to mainly, includes an oxide including one or more of indium (In), gallium (Ga), zinc (Zn), tin (Sn), titanium (Ti), and niobium (Nb). Specific but non-limiting examples of the material of the semiconductor film 13 may include indium tin oxide (ITZO), indium gallium oxide (IGZO: InGaZnO), zing oxide (ZnO), indium zinc oxide (IZO), indium gallium oxide (IGO), indium tin oxide (ITO), and indium oxide (InO). The semiconductor film 13 may have a thickness of 10 nm to 300 nm, for example. In an example, the semiconductor film 13 may have a thickness of 60 nm or less. As the thickness of the semiconductor film 13 decreases, the absolute number of defects in the semiconductor decreases, which suppresses a negative shift of a threshold voltage. This makes it possible to achieve superior transistor characteristics with a high on-off ratio. Additionally, a time required to form the semiconductor film 13 may be shortened, which makes it possible to improve productivity.

The low-resistance regions 13B of the semiconductor film 13 may be provided on opposite sides of the channel region 13A. One of the low-resistance regions 13B provided on one of the opposite sides of the channel region 13A may be coupled to the source-drain electrode 17A, and the other of the low-resistance regions 13B provided on the other of the opposite sides of the channel region 13A may be coupled to the source-drain electrode 17B. For example, a part of the low-resistance region 13B opposed to the through-hole 16V of the interlayer insulating film 16 may have an opening 13M. The opening 13M may be smaller in area than the through-hole 16V in plan view, for example. The opening 13M may overlie the opening 12M of the semiconductor auxiliary film 12 in plan view. The openings 12M and 13M may thus be filled with the source-drain electrode 17A or 17B which is in contact with the inner faces of the openings 12M and 13M. In other words, the source-drain electrodes 17A and 17B may be in contact with flat surfaces (i.e., top surfaces) of the semiconductor auxiliary film 12 and the semiconductor film 13 and may also be in contact with the inner face of the opening 12M of the semiconductor auxiliary film 12 and the inner face of the opening 13M of the semiconductor film 13. The source-drain electrodes 17A and 17B that are in contact with the inner face of the opening 12M of the semiconductor auxiliary film 12 and the inner face of the opening 13M of the semiconductor film 13 makes it possible to suppress an increase in contact resistance even when the source-drain electrodes 17A and 17B are in contact with the flat surfaces of the semiconductor auxiliary film 12 and the semiconductor film 13 in small area. The opening 13M may correspond to a specific but non-limiting example of a second opening according to one embodiment of the technology.

Figure 3:
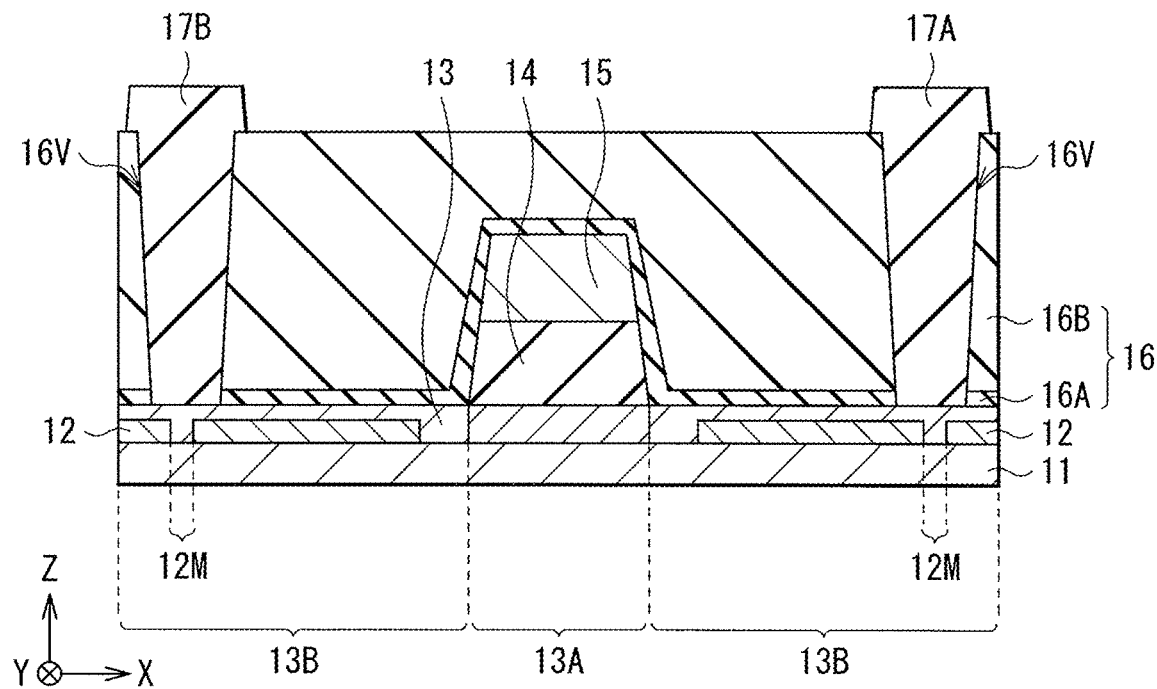
FIG. 3 is a schematic diagram illustrating another example cross-sectional configuration of a semiconductor device illustrated in FIG. 2.

FIG. 3 illustrates another example cross-sectional configuration of the semiconductor device 1. In this example illustrated in FIG. 3, the semiconductor film 13 may have no opening (the opening 13M in FIG. 2). The source-drain electrodes 17A and 17B may thus be in contact with the flat surface (top surface) of the semiconductor film 13.

The gate insulating film 14 provided between the channel region 13A of the semiconductor film 13 and the gate electrode 15 may have the same shape as the gate electrode 15 in plan view. The use of the gate insulating film 14 having such a shape makes it possible to achieve a thin-film transistor having a self-aligned structure. The gate insulating film 14 may be a single-layer film that has, for example, one of silicon oxide (SiO), silicon nitride (SiN), silicon nitride oxide (SiON), and aluminum oxide. Alternatively, the gate insulating film 14 may be a multi-layer film that has two or more thereof.

The gate electrode 15 provided on the gate insulating film 14 may control a carrier density of the channel region 13A on the basis of a gate voltage (Vg) applied thereto, and may serve as a wiring line that supplies an electric potential. The gate electrode 15 may include a metal that includes one of titanium (Ti), tungsten (W), tantalum (Ta), aluminum (Al), molybdenum (Mo), silver (Ag), neodymium (Nd), and copper (Cu) or an alloy that includes two or more thereof. Alternatively, the gate electrode 15 may be a compound that includes at least one of these components or a laminated film that includes two or more of these components. Still alternatively, the gate electrode 15 may be a transparent electrically conductive film that includes ITO, for example. The interlayer insulating film 16 may be provided over the entire surface of the substrate 11, for example. The interlayer insulating film 16 may be a laminated film that includes, in this order from the substrate 11, the interlayer insulating film 16A and the interlayer insulating film 16B, for example. The paired through-holes 16V may be disposed opposing to the respective low-resistance regions 13B of the semiconductor film 13, and extend through the interlayer insulating films 16A and 16B. Each of the through-holes 16V may have a quadrangular shape in plan view, for example (refer to FIG. 1). Alternatively, each of the through-holes 16V may have another shape in plan view.

The interlayer insulating film 16A may include a metal oxide film, such as an aluminum oxide (AlO) film, for example. The interlayer insulating film 16A may cover the gate electrode 15 and may be in contact with the low-resistance region 13B of the semiconductor film 13. Such a configuration in which the interlayer insulating film 16A in contact with the low-resistance region 13B includes a metal oxide makes it possible to stably keep the electric resistance of the low-resistance region 13B. The interlayer insulating film 16B provided on the interlayer insulating film 16A may be a photosensitive resin film, for example. For example, the interlayer insulating film 16B may include a polyimide resin. Alternatively, the interlayer insulating film 16B may include a novolak resin, an acrylic resin, or another resin. Optionally, an inorganic insulating film may be disposed between the interlayer insulating film 16A and the interlayer insulating film 16B. The inorganic insulating film may include, for example, silicon oxide (SiO), silicon nitride (SiN), or silicon oxide nitride (SiON). Optionally, an aluminum oxide (AlO) film or another film may be provided between the inorganic insulating film and the interlayer insulating film 16B.

The paired source-drain electrodes 17A and 17B may each serve as a source and a drain of the thin-film transistor. For example, the source-drain electrodes 17A and 17B may include a metal or a transparent electrically conductive film that is similar to that listed above as the material for the gate electrode 15. In one example embodiment, the source-drain electrodes 17A and 17B may include a material having high electrical conductivity. The source-drain electrodes 17A and 17B may each include a Ti film having a thickness of 50 nm and an AlSi film having a thickness of 500 nm that are laminated in this order, for example. The paired source-drain electrodes 17A and 17B may fill the respective through-holes 16V of the interlayer insulating film 16 so as to be in contact with the semiconductor film 13. The paired source-drain electrodes 17A and 17B may extend through the openings 12M and 13M so as to be in contact with the semiconductor auxiliary film 12.

[Operations]

In the semiconductor device 1 according to an example embodiment of the technology, the channel region 13A of the semiconductor film 13 may be activated when an ON voltage equal to or greater than a threshold voltage is applied to the gate electrode 15. This causes an electric current to flow between the paired low-resistance regions 13B.

[Workings and Effects]

In the semiconductor device 1 according to an example embodiment of the technology, the semiconductor auxiliary film 12 has the openings 12M opposed to the respective through-holes 16V of the interlayer insulating film 16. This configuration suppresses migration of oxygen from the semiconductor film 13 to the source-drain electrodes 17A and 17B through the semiconductor auxiliary film 12. Example workings and effects of the semiconductor device 1 will now be described with reference to a comparative example.

Figure 4:
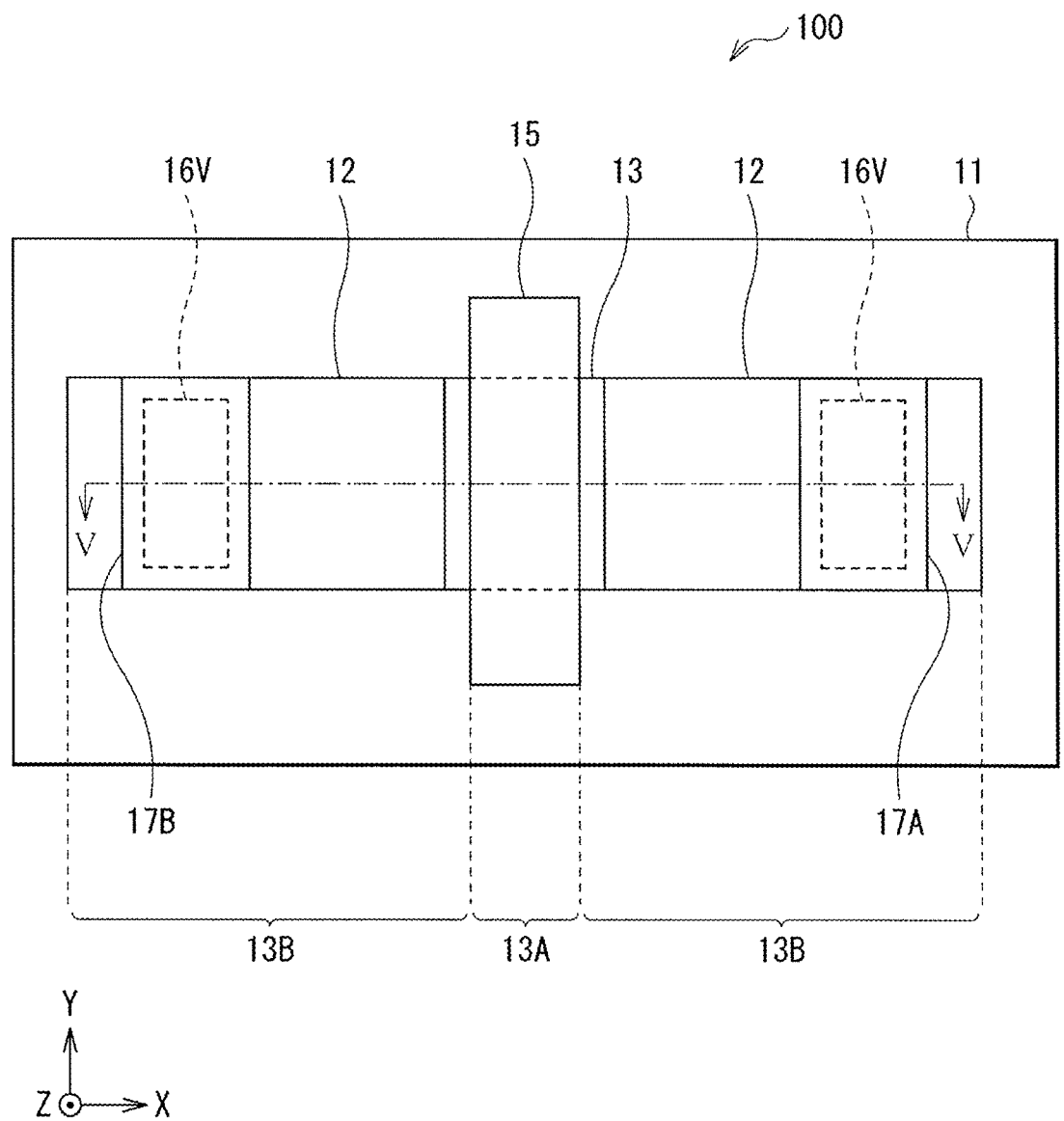
FIG. 4 is a schematic plan view of a main portion of a semiconductor device according to a comparative example.
Figure 5:
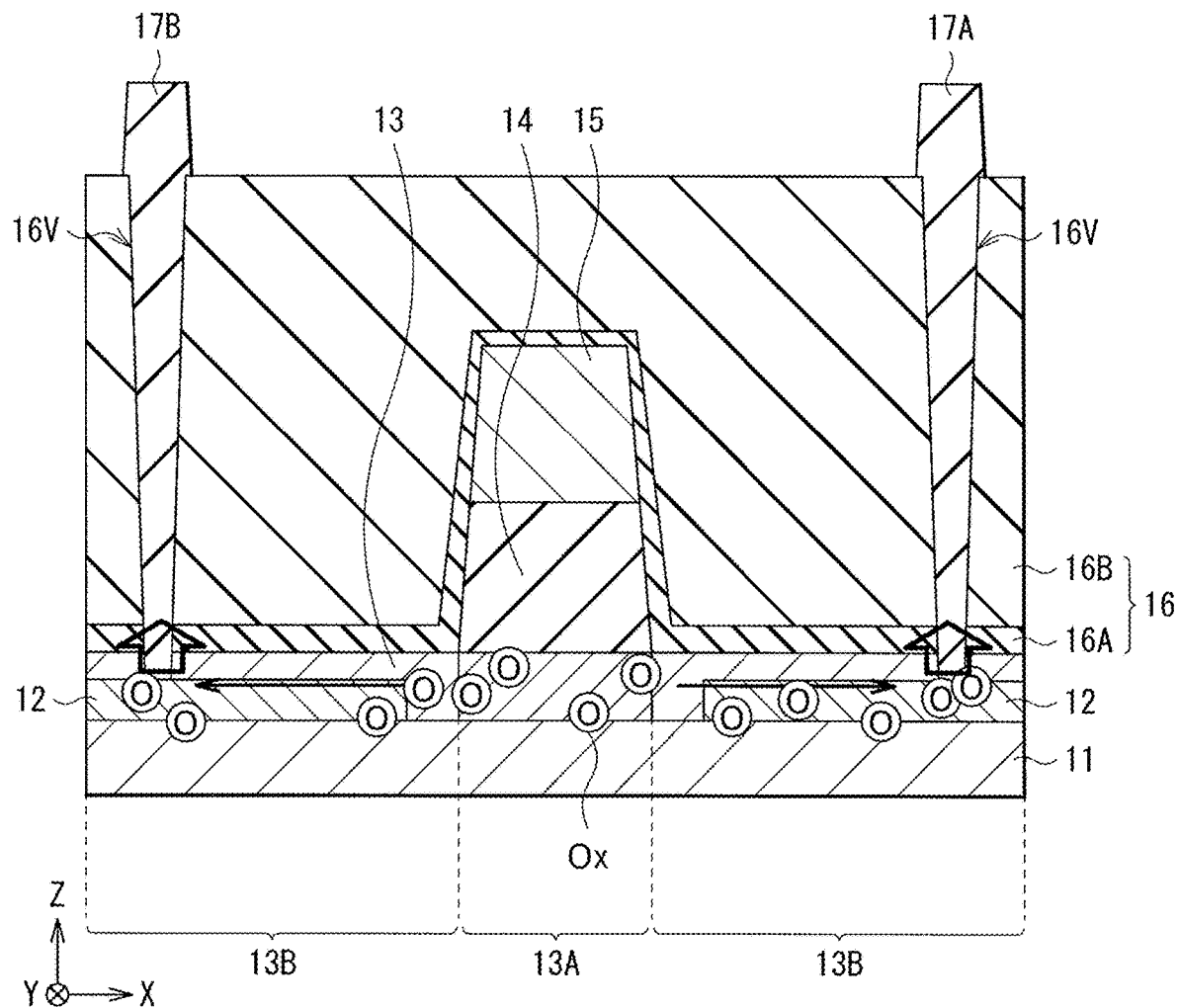
FIG. 5 is a schematic cross-sectional view of the semiconductor device illustrated in FIG. 4 taken along the line V-V in FIG. 4.

FIGS. 4 and 5 illustrate a schematic configuration of a main portion of a semiconductor device 100 according to a comparative example. FIG. 4 is a plan view of the main portion of the semiconductor device 100, and FIG. 5 is a cross-sectional view of the semiconductor device 100 taken along the line V-V in FIG. 4. FIG. 4 is for a comparison with FIG. 1 illustrating the plan view of the semiconductor device 1, and FIG. 5 is for comparison with FIG. 2 illustrating the cross-sectional view of the semiconductor device 1. Like the semiconductor device 1, the semiconductor device 100 includes, on the substrate 11, the semiconductor auxiliary film 12, the semiconductor film 13, the gate insulating film 14, the gate electrode 15, the interlayer insulating film 16, and the source-drain electrodes 17A and 17B. The semiconductor device 100 is different from the semiconductor device 1 in that the semiconductor auxiliary film 12 of the semiconductor device 100 has no opening (the opening 12M illustrated in FIG. 2).

The source-drain electrodes 17A and 17B each have a property that extracts oxygen (Ox) from the semiconductor film 13, as illustrated in FIG. 5. The property of extracting oxygen becomes prominent in a case where the source-drain electrodes 17A and 17B include an easily oxidizable metal, such as titanium (Ti) or aluminum (Al), for example. In the semiconductor device 100, the semiconductor auxiliary film 12 is provided over the entirety of a portion opposed to the through-holes 16V. The semiconductor auxiliary film 12 provided over the entirety of the portion opposed to the through-holes 16V facilitates the extraction of oxygen (Ox) from the channel region 13A of the semiconductor film 13 to the source-drain electrodes 17A and 17B. For example, the amount of oxygen (Ox) in the channel region 13A is significantly reduced through a thermal process (e.g., annealing) performed after the formation of the source-drain electrodes 17A and 17B. Such a reduction in the oxygen (Ox) in the channel region 13A can cause a change in a Vg-Id characteristic, such as a depression. The change in characteristics can result in inconvenience, such as a malfunction of the semiconductor device 100.

In contrast, in the semiconductor device 1 according to any foregoing example embodiment of the technology, the semiconductor auxiliary film 12 has the openings 12M opposed to the respective through-holes 16V. Therefore, migration of oxygen (Ox) from the semiconductor film 13 to the source-drain electrodes 17A and 17B through the semiconductor auxiliary film 12 is unlikely to occur at or near the openings 12M. As a result, the semiconductor device 1 suppresses the migration of oxygen from the semiconductor film 13 to the source-drain electrodes 17A and 17B through the semiconductor auxiliary film 12, compared with the semiconductor device 100. Accordingly, it is possible for the semiconductor device 1 to suppress a reduction in oxygen (Ox) in the channel region 13A while maintaining the Vg-Id characteristic.

Additionally, in the semiconductor device 1 according to some of the foregoing example embodiments of the technology, the opening 12M may be provided on a part of portions opposed to the through-hole 16V. Each of the source-drain electrodes 17A and 17B may thus be in contact with the flat surface (top surface) of the semiconductor auxiliary film 12 and the inner face of the opening 12M of the semiconductor auxiliary film 12. Such a configuration makes it possible to stably keep the contact resistance between the the source-drain electrode 17A or 17B and the semiconductor auxiliary film 12 more easily than the configuration of a semiconductor device (e.g., a semiconductor device 1A illustrated in FIGS. 6 and 7 described below) in which the openings 12M are each provided over the entirety of a portion of the semiconductor auxiliary film 12 opposed to the through-hole 16V.

As described above, in any foregoing example embodiment of the technology, the semiconductor auxiliary film 12 has the opening 12M opposed to the through-hole 16V of the interlayer insulating film 16. This suppresses a reduction in the amount of oxygen (Ox) in the semiconductor film 13. Accordingly, it is possible to suppress a change in characteristics, such as the Vg-Id characteristic.

According to some of the foregoing example embodiments of the technology, the opening 12M may be provided on a part of a portion of the semiconductor auxiliary film 12 opposed to the through-hole 16V. Such a configuration makes it possible to stably keep the contact resistance between the source-drain electrode 17A or 17B and the semiconductor auxiliary film 12 more easily.

Modification examples of the foregoing example embodiment will now be described. In the following description, the same reference numerals are assigned to components the same as those in the foregoing example embodiment without a redundant description thereof.

2. Modification Examples

Figure 6:
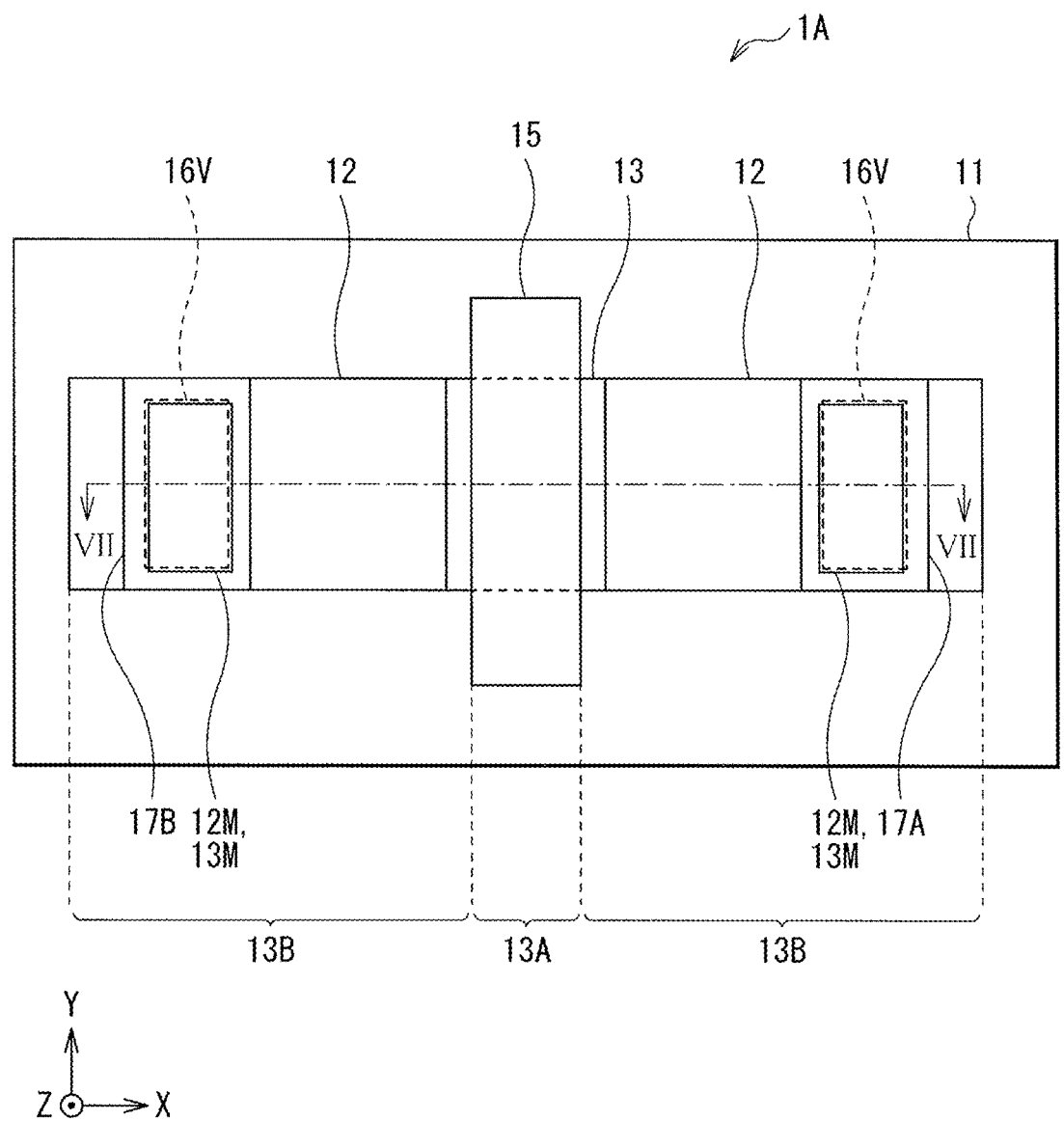
FIG. 6 is a schematic plan view of a main portion of a semiconductor device according to a modification example of the technology.
Figure 7:
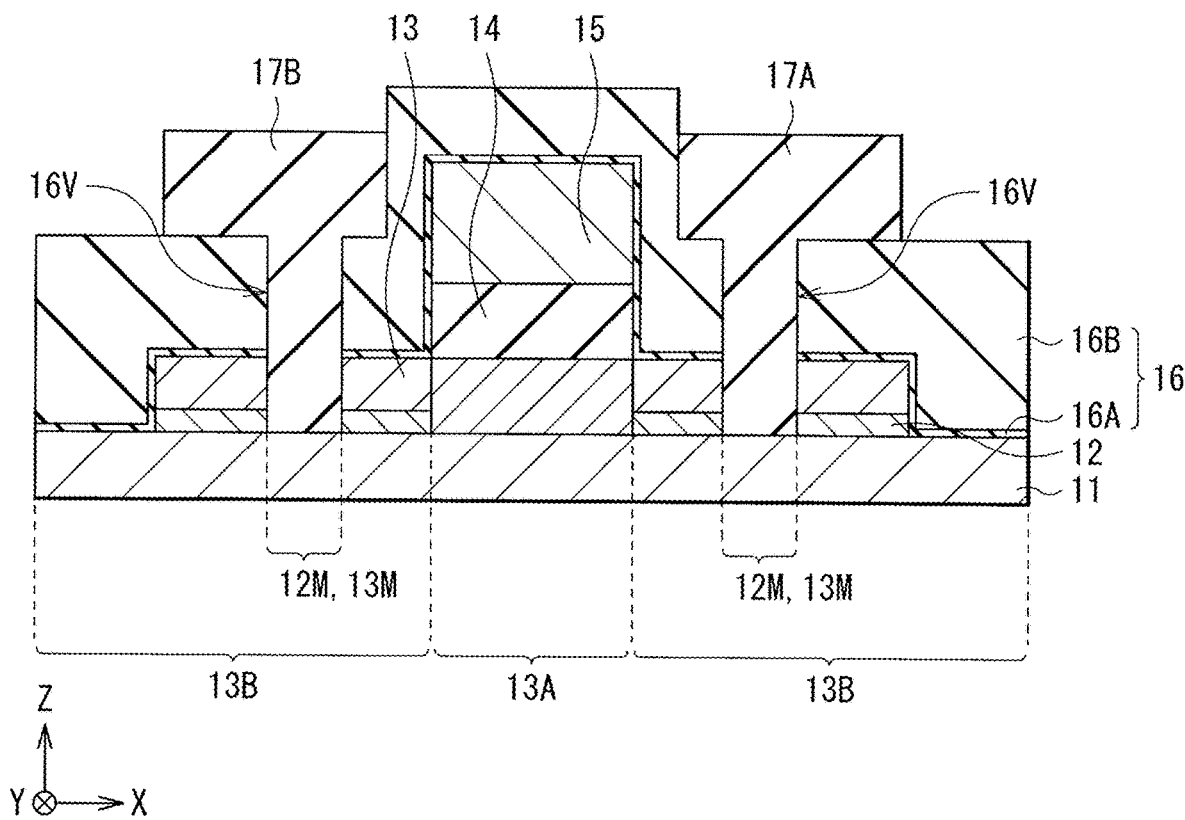
FIG. 7 is a schematic cross-sectional view of the semiconductor device illustrated in FIG. 6 taken along the line VII-VII in FIG. 6.

FIGS. 6 and 7 schematically illustrate a main portion of a semiconductor device 1A according to a modification example of the foregoing example embodiment of the technology. FIG. 6 is a plan view of a main portion of the semiconductor device 1A, and FIG. 7 is a cross-sectional view of the semiconductor device 1A taken along the line VII-VII in FIG. 6. The semiconductor device 1A may have the openings 12M each provided over the entirety of a portion of the semiconductor auxiliary film 12 opposed to the through-hole 16V. Except this point, the configuration, workings, and effects of the semiconductor device 1A according to the modification example may be similar to those of the semiconductor device 1 according to the foregoing example embodiment of the technology.

For example, the opening 12M of the semiconductor auxiliary film 12 may have substantially the same shape as the through-hole 16V of the interlayer insulating film 16 in plan view. The opening 12M and the through-hole 16V may have a quadrangular shape, for example and be substantially the same in size in plan view. Alternatively, the through-hole 16V may have a tapered shape, and the opening 12M may be shaped along the tapered shape of the through-hole 16V to be smaller than the through-hole 16V in plan view. Still alternatively, the through-hole 16V may be different in shape from the opening 12M in plan view due to a manufacturing error, for example.

The semiconductor film 13 may have the openings 13M overlying the respective openings 12M of the semiconductor auxiliary film 12 in plan view. For example, each of the openings 13M may have a size substantially the same as that of the corresponding opening 12M in plan view.

FIGS. 8A to 8D illustrate example processes for manufacturing the semiconductor device 1A in a sequential order.

Figure 8A:
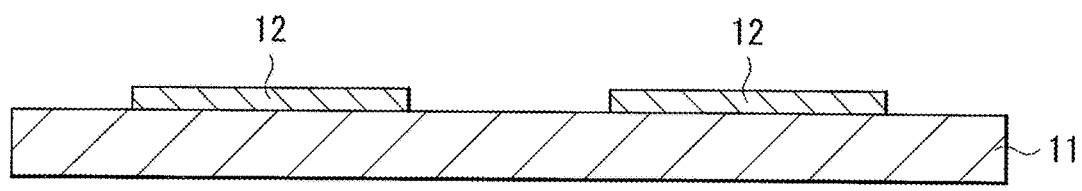
FIG. 8A is a schematic cross-sectional view of the semiconductor device illustrated in FIG. 7 for illustrating an example process of a method of manufacturing the semiconductor device illustrated in FIG. 7.

First, the semiconductor auxiliary film 12 may be formed on the substrate 11, as illustrated in FIG. 8A. For example, the semiconductor auxiliary film 12 may be formed as follows. An IZO film may be formed first on the substrate 11 by sputtering, for example. Thereafter, the IZO film may be patterned into a predetermined shape by photolithography or wet-etching. The semiconductor auxiliary film 12 may be thereby formed in a selective region on the substrate 11. Optionally, a UC film may be formed over the entire surface of the substrate 11 before forming the semiconductor auxiliary film 12.

Note that the semiconductor device 1 may be manufactured through a procedure similar to the procedure for manufacturing the semiconductor device 1A.

Figure 8B:
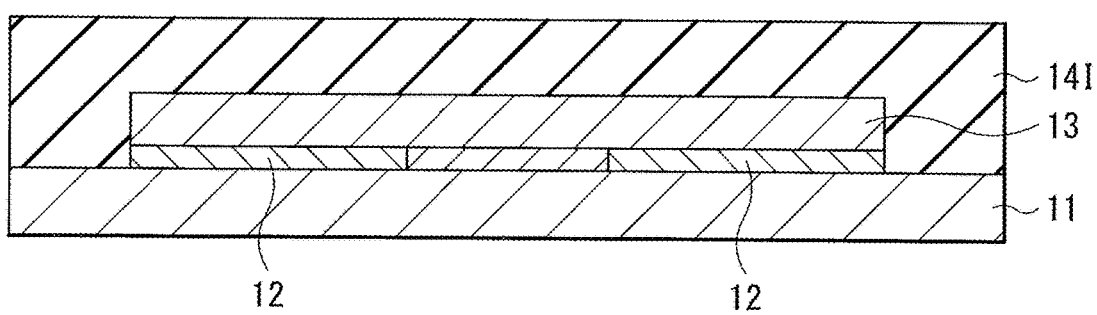
FIG. 8B is a schematic cross-sectional view of the semiconductor device illustrated in FIG. 7 for illustrating an example process subsequent to the process of FIG. 8A.
Figure 9:
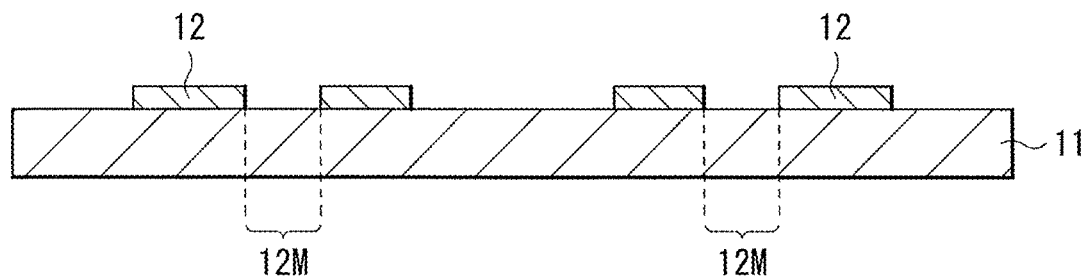
FIG. 9 is a schematic cross-sectional view of the semiconductor device illustrated in FIG. 2 for illustrating an example process of a manufacturing method of the semiconductor device illustrated in FIG. 2.

FIG. 9 illustrates the procedure for manufacturing the semiconductor device 1. The procedure for manufacturing the semiconductor device 1 may also start with forming the semiconductor auxiliary film 12 on the substrate 11, as illustrated in FIG. 8A. Thereafter, in the procedure for manufacturing the semiconductor device 1, the openings 12M may be formed in the semiconductor auxiliary film 12 before forming the semiconductor film 13, as illustrated in FIG. 9. After the formation of the semiconductor auxiliary film 12, the semiconductor film 13 and an insulating film 141 may be formed in this order, as illustrated in FIG. 8B. For example, the semiconductor film 13 and the insulating film 141 may be formed as follows. First, a film including, for example, an oxide semiconductor material may be formed over the entire surface of the substrate 11 by sputtering, for example. Thereafter, the film including the oxide semiconductor material may be patterned into a predetermined shape by photolithography or wet-etching, for example. Thereafter, a resist may be removed, and annealing may be performed to form the semiconductor film 13 covering the semiconductor auxiliary film 12. Thereafter, an oxide silicon (SiO) film having a thickness of 200 nm may be formed by CVD, for example, over the entire surface of the substrate 11 so as to cover the semiconductor film 13.

The insulating film 141 may be thereby formed. The insulating film 141 may be formed into the gate insulating film 14 in a later process.

Figure 8C:
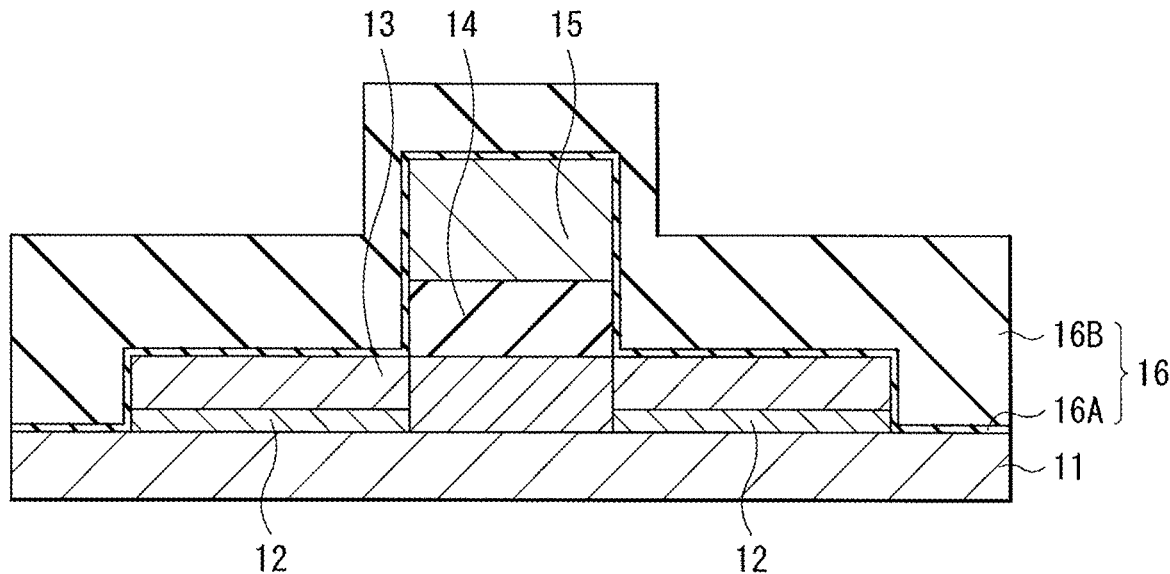
FIG. 8C is a schematic cross-sectional view of the semiconductor device illustrated in FIG. 7 for illustrating an example process subsequent to the process of FIG. 8B.

Thereafter, with reference to FIG. 8C, the gate electrode 15, the gate insulating film 14, and the interlayer insulating film 16 may be formed. For example, these layers may be formed as follows. First, an electrically-conductive film including, for example, a metal material may be formed over the entire surface of the substrate 11. Next, a photoresist having a predetermined pattern may be formed on the electrically-conductive film. The electrically-conductive film and the insulating film 141 may be sequentially patterned with use of the photoresist. The gate electrode 15 and the gate insulating film 14 that have the same shape in plan view may be thereby formed. Thereafter, the interlayer insulating film 16 (including the interlayer insulating films 16A and 16B) may be formed over the entire surface of the substrate 11.

Figure 8D:
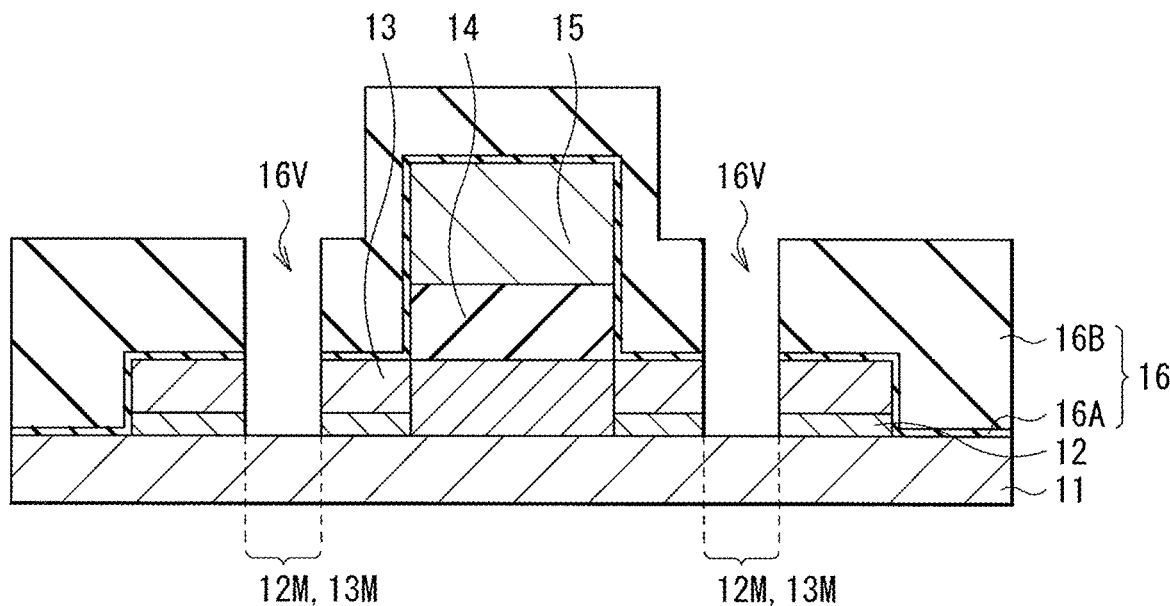
FIG. 8D is a schematic cross-sectional view of the semiconductor device illustrated in FIG. 7 for illustrating an example process subsequent to the process of FIG. 8C.

After forming the interlayer insulating film 16, the through-holes 16V may be formed together with the openings 12M and 13M, as illustrated in FIG. 8D. The through-holes 16V and the openings 12M and 13M may be formed by photolithography or dry-etching, for example. Thereafter, the source-drain electrodes 17A and 17B may be formed on the interlayer insulating film 16. Thereafter, a thermal process may be performed. Through the example procedure described above, the semiconductor device 1A illustrated in FIGS. 6 and 7 may be manufactured.

Figure 10:
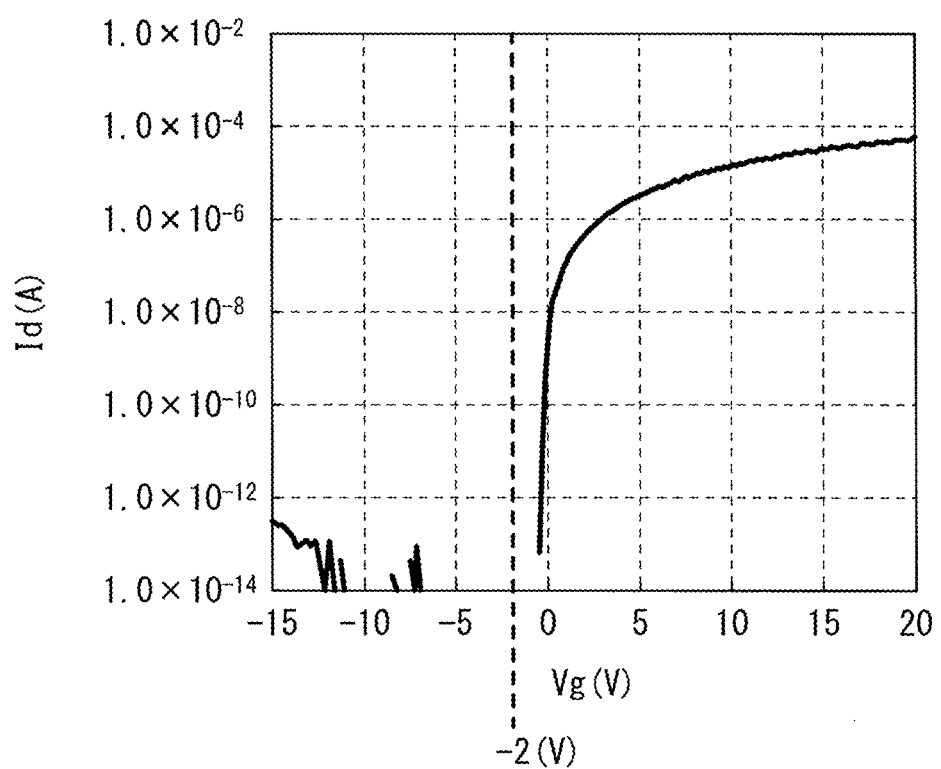
FIG. 10 is a graph illustrating Vg-Id characteristic of the semiconductor devices illustrated in FIGS. 5 and 7 before a thermal process.
Figure 11A:
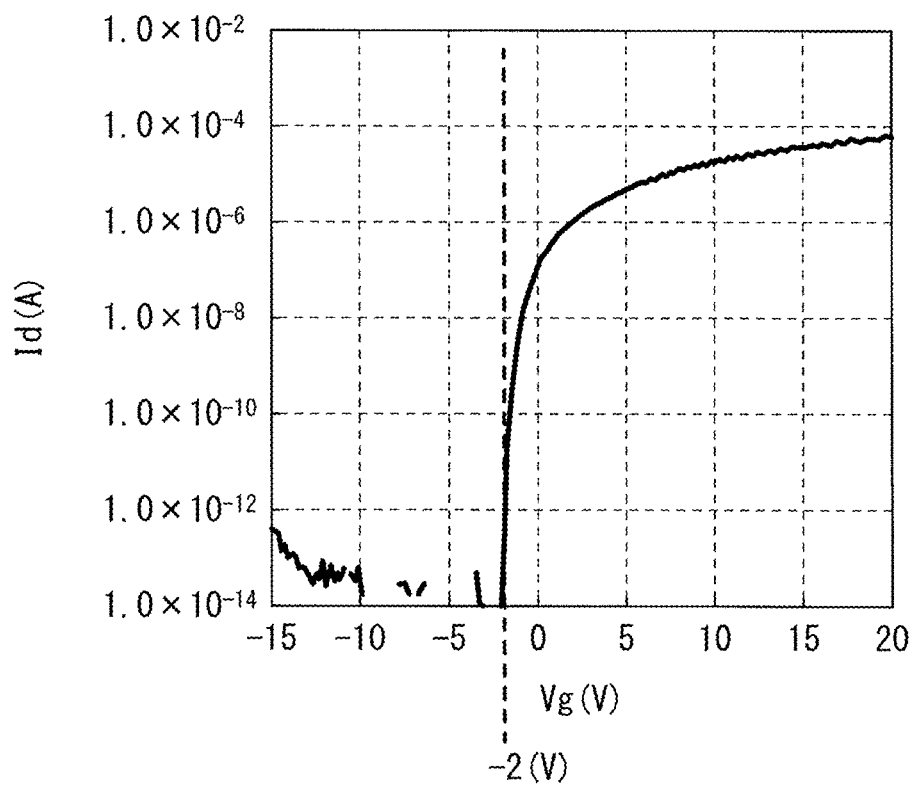
FIG. 11A is a graph illustrating the Vg-Id characteristic of the semiconductor device illustrated in FIG. 5 after the thermal process.
Figure 11B:
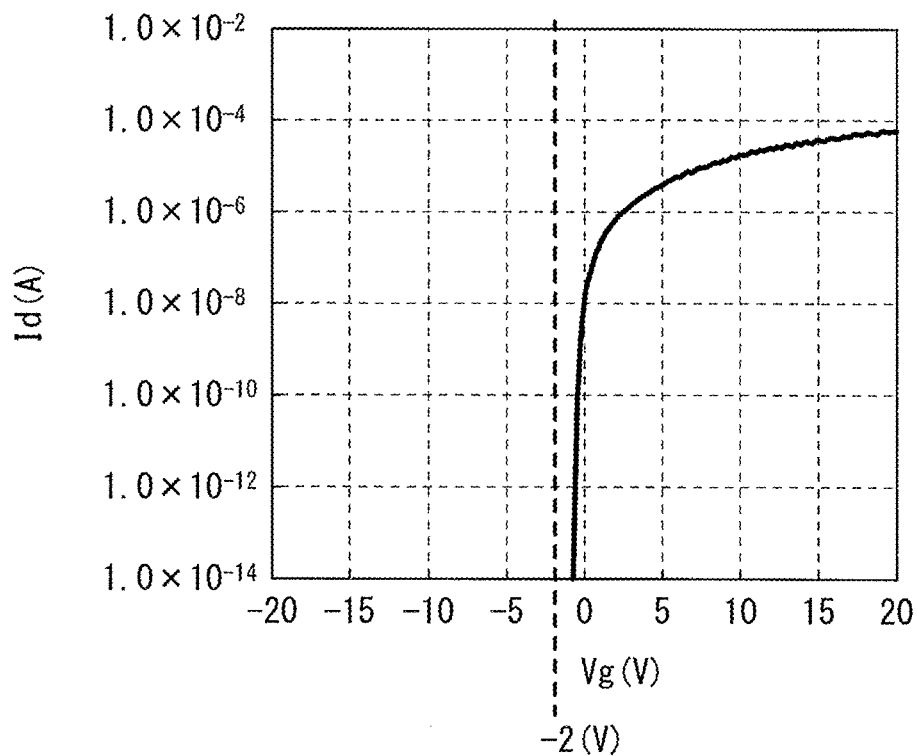
FIG. 11B is a graph illustrating the Vg-Id characteristic of the semiconductor device illustrated in FIG. 7 after the thermal process.

FIG. 10 illustrates the Vg-Id characteristic of the semiconductor device measured before the thermal process (e.g., annealing process) that is to be performed after the formation of the source-drain electrodes 17A and 17B. FIGS. 11A and 11B illustrate the Vg-Id characteristic measured after the thermal process. FIG. 11A illustrates the Vg-Id characteristic of the semiconductor device 100, and FIG. 11B illustrates the Vg-Id characteristic of the semiconductor device 1A. It is apparent from the comparison of FIG. 10 and FIG. 11A that the thermal process causes depression of the semiconductor device 100, which results in a significant shift in a threshold voltage Vth in a negative direction. In contrast, it is apparent from FIG. 11B that the thermal process causes substantially no depression in the semiconductor device 1A, which hardly results in a shift in the threshold voltage Vth (FIG. 11B). Similar results were obtained for the semiconductor device 1.

As in the semiconductor device 1, the semiconductor device 1A according to the modification example includes the semiconductor auxiliary film 12 having the openings 12M that are opposed to the respective through-holes 16V of the interlayer insulating film 16. This suppresses migration of oxygen from the semiconductor film 13 to the source-drain electrodes 17A and 17B through the semiconductor auxiliary film 12. Accordingly, it is possible to suppress a change in the Vg-Id characteristic. Further, the source-drain electrodes 17A and 17B may be in contact with the the inner faces of the openings 12M of the semiconductor auxiliary film 12 and the openings 13M of the semiconductor film 13. Such a configuration keeps the contact resistance between the source-drain electrode 17A or 17B and the semiconductor auxiliary film 12 at a sufficiently low level.

Furthermore, the openings 12M of the semiconductor auxiliary film 12 may be formed together with the through-holes 16V of the interlayer insulating film 16. This eliminates the need for increasing the number of processes and facilitates manufacturing of the semiconductor device 1A through a simple method.

Application Example 1: Display and Imaging Unit

The semiconductor device 1 according to any of the foregoing example embodiments or the semiconductor device 1A according to any of the foregoing modification examples is applicable to a driving circuit of a display (e.g., a display 2A illustrated in FIG. 12 described below) and an imaging unit (e.g., an imaging unit 2B illustrated in FIG. 13 described below), for example.

Figure 12:
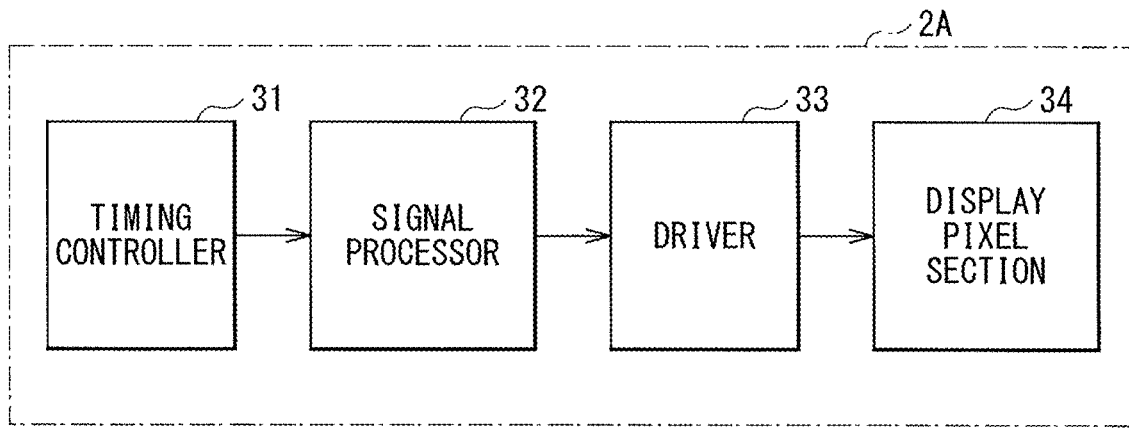
FIG. 12 is a block diagram of a display to which the semiconductor device illustrated in, for example.

FIG. 12 is a block diagram of a display 2A. The display 2A may display an image signal internally or externally generated in the form of a screen image. The display 2A may be applied to, for example, a liquid crystal display, as well as an organic EL display described above. The display 2A may include, for example, a timing controller 31, a signal processor 32, a driver 33, and a display pixel section 34.

The timing controller 31 may include a timing generator that generates various timing signals or control signals. The timing controller 31 may drive the signal processor 32 and other components on the basis of the various timing signals. The signal processor 32 may perform a predetermined correction on a digital image signal received from an external device, for example, and output the corrected image signal to the driver 33. The driver 33 may include, for example, a scanning-line driving circuit and a signal-line driving circuit. The driver 33 may drive pixels in the display pixel section 34 via various control lines. The display pixel section 34 may include, for example, a display element, such as an organic EL element or a liquid crystal display element, and a pixel circuit that drives the display element per pixel. The semiconductor device described above may be applied to various circuitry that constitutes a portion of the driver 33 or a portion of the display pixel section 34, for example.

Figure 13:
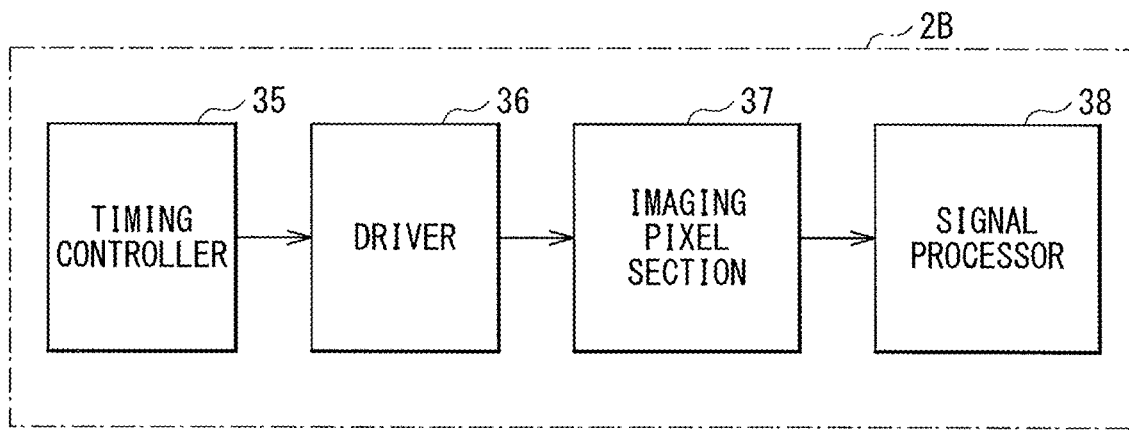
FIG. 13 is a block diagram of an imaging unit to which the semiconductor device illustrated in, for example.

FIG. 13 is a block diagram of the imaging unit 2B. The imaging unit 2B may be a solid-state imaging unit that receives an image in the form of electric signals, for example. The imaging unit 2B may be, for example, a charge coupled device (CCD) or a complementary metal oxide semiconductor (CMOS) image sensor. The imaging unit 2B may include, for example, a timing controller 35, a driver 36, an imaging pixel section 37, and a signal processor 38.

The timing controller 35 may include a timing generator that generates various timing signals or control signals. The timing controller 35 may drive the driver 36 on the basis of the various timing signals. The driver 36 may include, for example, a row selection circuit, an AD converter circuit, and a horizontal transfer scanning circuit. The driver 36 may read signals from pixels in the imaging pixel section 37 via various control lines. The imaging pixel section 37 may include an imaging element or a photoelectric transducer, such as a photodiode, and a pixel circuit that reads signals. The signal processor 38 may perform various signal processes on a signal received from the imaging pixel section 37. The semiconductor device described above may be applied to various circuitry that constitutes a portion of the driver 36 or a portion of the imaging pixel section 37, for example.

Application Example 2: Electronic Apparatus

Figure 14:
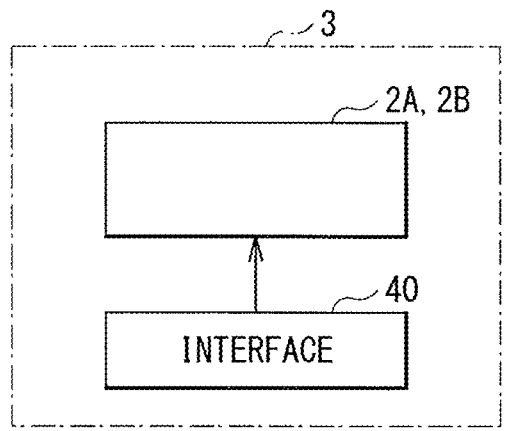
FIG. 14 is a block diagram of an electronic apparatus according to one example embodiment of the technology.

The display 2A and the imaging unit 2B are applicable to various electronic apparatuses. FIG. 14 is a block diagram of an electronic apparatus 3. Specific but non-limiting examples of the electronic apparatus 3 may include a television apparatus, a personal computer (PC), a smartphone, a tablet PC, a mobile phone, a digital still camera, and a digital video camera.

The electronic apparatus 3 may include, for example, the display 2A or the imaging unit 2B described above, and an interface 40. The interface 40 may be an input section to which various external signals and power are inputted. Optionally, the interface 40 may include a user interface, such as a touch panel, a keyboard, or operational keys.

Although the technology is described with reference to the example embodiments, modification examples, and application examples hereinabove, these example embodiments, modification examples, and application examples are not to be construed as limiting the scope of the technology and may be modified in a wide variety of ways. For example, the materials and thicknesses of the layers described in the example embodiments should not be limited to those described above, and may be different from those described above.

In some of the foregoing example embodiments, modification examples, and application examples, the semiconductor auxiliary film 12 may be in contact with the bottom surface of the semiconductor film 13. In an alternative embodiment of the technology, the semiconductor auxiliary film 12 may be in contact with the top surface of the semiconductor film 13.

Figure 15:
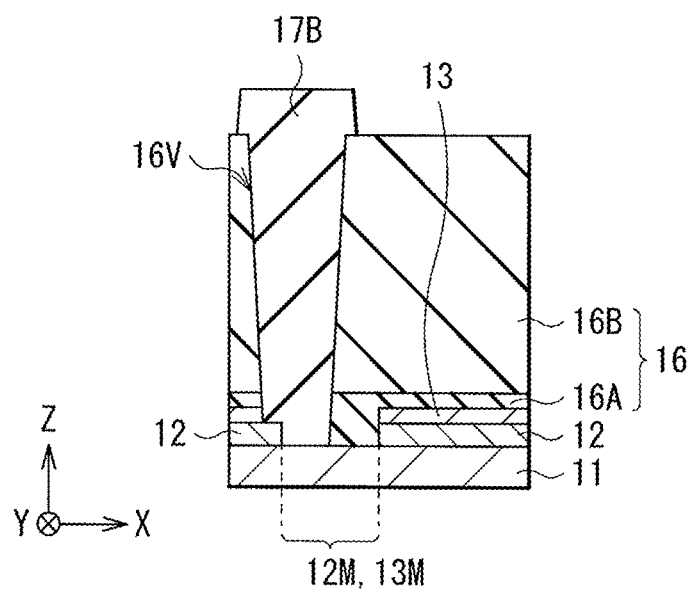
FIG. 15 is a schematic cross-sectional view of the semiconductor device illustrated in FIG. 7 for illustrating other examples of a through-hole and an opening.

In some of the modification examples described above with reference to FIG. 7, the through-holes 16V overlie the openings 12M and 13M in plan view. In another embodiment of the technology illustrated in FIG. 15, the through-holes 16V may be displaced from the openings 12M and 13M in plan view. An allowable amount of the displacement may be in a range that ensures the contact between the inner faces of the openings 12M and 13M and the source-drain electrodes 17A and 17B.

It should be appreciated that the effects described herein are mere examples. Effects of the example embodiment, modification example, and application examples of the technology are not limited to those described herein, and may be different from those described herein. The technology may further include any effects other than those described herein.

It is possible to achieve at least the following configurations from the foregoing example embodiments of the technology.

(1) A semiconductor device including:
a semiconductor film including an oxide semiconductor material and having a channel region and a low-resistance region, the low-resistance region having an electric resistance lower than an electric resistance of the channel region;
an interlayer insulating film covering the semiconductor film and having a through-hole opposed to the low-resistance region;
a source-drain electrode including a source electrode and a drain electrode and being electrically coupled to the semiconductor film through the through-hole; and
a semiconductor auxiliary film being in contact with the low-resistance region of the semiconductor film, reducing an electric resistance of the semiconductor film, and having a first opening at least on a part of a portion opposed to the through-hole.

(2) The semiconductor device according to (1), in which the first opening is provided on the part of the portion opposed to the through-hole.

(3) The semiconductor device according to (2), in which the first opening includes a plurality of first openings, and the plurality of first openings is provided on the portion opposed to the through-hole.

(4) The semiconductor device according to (1), in which the first opening is provided on an entirety of the portion opposed to the through-hole.
(5) The semiconductor device according to any one of (1) to (4), in which the semiconductor film having a second opening at least on the part of the portion opposed to the through-hole.
(6) The semiconductor device according to any one of (1) to (5), in which the source-drain electrode is in contact with an inner face of the first opening of the semiconductor auxiliary film.
(7) The semiconductor device according to any one of (1) to (6), in which the semiconductor auxiliary film includes a metal or a metal oxide.
(8) The semiconductor device according to any one of (1) to (7), in which the semiconductor auxiliary film includes indium tin oxide or indium zinc oxide.
(9) The semiconductor device according to any one of (1) to (8), further including:
a substrate;
a gate electrode opposed to the channel region; and
a gate insulating film provided between the gate electrode and the semiconductor film,
the semiconductor auxiliary film, the semiconductor film, the gate insulating film, and the gate electrode being provided on the substrate in this order.
(10) The semiconductor device according to any one of (1) to (9), in which the interlayer insulating film includes a metal oxide film in contact with the low-resistance region of the semiconductor film.
(11) The semiconductor device according to any one of (1) to (10), in which the semiconductor auxiliary film is provided in a selective region opposed to the low-resistance region of the semiconductor film having the channel region and the low-resistance region.
(12) A display with a display element and a semiconductor device configured to drive the display element, the semiconductor device comprising:
a semiconductor film including an oxide semiconductor material and having a channel region and a low-resistance region, the low-resistance region having an electric resistance lower than an electric resistance of the channel region;
an interlayer insulating film covering the semiconductor film and having a through-hole opposed to the low-resistance region;
a source-drain electrode including a source electrode and a drain electrode and being electrically coupled to the semiconductor film through the through-hole; and
a semiconductor auxiliary film being in contact with the low-resistance region of the semiconductor film, reducing an electric resistance of the semiconductor film, and having a first opening at least on a part of a portion opposed to the through-hole.

The semiconductor device and the display according to any of the foregoing example embodiments of the technology includes the semiconductor auxiliary film having a first opening opposed to the through-hole of the interlayer insulating film. Accordingly, it is possible to suppress migration of oxygen from the semiconductor film to the source-drain electrode through the semiconductor auxiliary film.

The semiconductor device and the display according to any of the foregoing example embodiment of the technology includes the semiconductor auxiliary film having a first opening opposed to the through-hole of the interlayer insulating film. This suppresses a reduction in the amount of oxygen in the semiconductor film. Accordingly, it is possible to suppress a change in characteristics, such as the Vg-Id characteristic. It is to be noted that effects of the example embodiments, modification examples, and application examples of the technology should not be limited to those described hereinabove, and may be any effect described herein.

Although the technology is described hereinabove in terms of example embodiments, modification examples, and application examples, it is not limited thereto. It should be appreciated that variations may be made in the described example embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. The term "disposed on/provided on/formed on" and its variants as used herein refer to elements disposed directly in contact with each other or indirectly by having intervening structures therebetween. Moreover, no element or component in this technology is intended to be dedicated to the public regardless of whether the element or component is explicitly recited in the following claims.

What is claimed is:

1. A semiconductor device comprising:
a semiconductor film including an oxide semiconductor material and having a channel region and a low-resistance region, the low-resistance region having an electric resistance lower than an electric resistance of the channel region;
an interlayer insulating film covering the semiconductor film and having a through-hole opposed to the low-resistance region;
a source-drain electrode including a source electrode and a drain electrode and being electrically coupled to the semiconductor film through the through-hole; and
a semiconductor auxiliary film being in contact with the low-resistance region of the semiconductor film, reducing an electric resistance of the semiconductor film, having a first opening at least on a part of a portion opposed to the through-hole, and a bottom-most surface of the semiconductor film is co-planar with a bottom-most surface of the semiconductor auxiliary film.

2. The semiconductor device according to claim 1, wherein
the first opening is provided on the part of the portion opposed to the through-hole.

3. The semiconductor device according to claim 2, wherein
the first opening comprises a plurality of first openings, and
the plurality of first openings is provided on the portion opposed to the through-hole.

4. The semiconductor device according to claim 1, wherein the first opening is provided on an entirety of the portion opposed to the through-hole.

5. The semiconductor device according to claim 1, wherein the semiconductor film has a second opening at least on the part of the portion opposed to the through-hole.

6. The semiconductor device according to claim 1, wherein the source-drain electrode is in contact with an inner face of the first opening of the semiconductor auxiliary film.

7. The semiconductor device according to claim 1, wherein the semiconductor auxiliary film includes a metal or a metal oxide.

8. The semiconductor device according to claim 1, wherein the semiconductor auxiliary film includes indium tin oxide or indium zinc oxide.

9. The semiconductor device according to claim 1, further comprising:
- a substrate;
- a gate electrode opposed to the channel region; and
- a gate insulating film provided between the gate electrode and the semiconductor film,
- the semiconductor auxiliary film, the semiconductor film, the gate insulating film, and the gate electrode being provided on the substrate in this order.

10. The semiconductor device according to claim 1, wherein the interlayer insulating film includes a metal oxide film in contact with the low-resistance region of the semiconductor film.

11. The semiconductor device according to claim 1, wherein the semiconductor auxiliary film is provided in a selective region opposed to the low-resistance region of the semiconductor film having the channel region and the low-resistance region.

12. The semiconductor device of claim 1, further comprising a substrate, wherein the channel region directly contacts the substrate.

13. The semiconductor device of claim 1, wherein the semiconductor film extends along an entirety of a sidewall of the semiconductor auxiliary film.

14. The semiconductor device of claim 1, wherein a region below the channel region is free of the semiconductor auxiliary film.

15. The semiconductor device of claim 1, wherein a thickness of the semiconductor film over the semiconductor auxiliary film is less than a thickness of the channel region.

16. A display with a display element and a semiconductor device configured to drive the display element, the semiconductor device comprising:
- a semiconductor film including an oxide semiconductor material and having a channel region and a low-resistance region, the low-resistance region having an electric resistance lower than an electric resistance of the channel region;
- an interlayer insulating film covering the semiconductor film and having a through-hole opposed to the low-resistance region;
- a source-drain electrode including a source electrode and a drain electrode and being electrically coupled to the semiconductor film through the through-hole; and
- a semiconductor auxiliary film being in contact with the low-resistance region of the semiconductor film, reducing an electric resistance of the semiconductor film, having a first opening at least on a part of a portion opposed to the through-hole, and the semiconductor film extends along an entirety of a sidewall of the semiconductor auxiliary film.

17. The display of claim 16, further comprising a substrate, wherein the channel region directly contacts the substrate.

18. The display of claim 16, wherein a bottom-most surface of the semiconductor film is co-planar with a bottom-most surface of the semiconductor auxiliary film.

19. The display of claim 16, wherein a region below the channel region is free of the semiconductor auxiliary film.

20. The display of claim 16, wherein a thickness of the semiconductor film over the semiconductor auxiliary film is less than a thickness of the channel region.

* * * * *